United States Patent
Senzai et al.

(10) Patent No.: US 11,709,209 B2
(45) Date of Patent: Jul. 25, 2023

(54) CAPACITOR LIFESPAN ESTIMATION METHOD, LIFESPAN ESTIMATION PROGRAM THEREOF, INFORMATION PROCESSING DEVICE, AND CAPACITOR

(71) Applicant: NIPPON CHEMI-CON CORPORATION, Tokyo (JP)

(72) Inventors: Daizou Senzai, Tokyo (JP); Toshihiko Furukawa, Buena Park, CA (US)

(73) Assignee: NIPPON CHEMI-CON CORPORATION, Tokyo (JP)

( * ) Notice: Subject to any disclaimer, the term of this patent is extended or adjusted under 35 U.S.C. 154(b) by 234 days.

(21) Appl. No.: 17/276,647

(22) PCT Filed: Sep. 27, 2019

(86) PCT No.: PCT/JP2019/038070
§ 371 (c)(1),
(2) Date: Mar. 16, 2021

(87) PCT Pub. No.: WO2020/067393
PCT Pub. Date: Apr. 2, 2020

(65) Prior Publication Data
US 2021/0293900 A1 Sep. 23, 2021

(30) Foreign Application Priority Data
Sep. 28, 2018 (JP) .................. 2018-184290

(51) Int. Cl.
*G01R 27/26* (2006.01)
*G01R 31/64* (2020.01)
*H01G 9/21* (2006.01)

(52) U.S. Cl.
CPC .............. *G01R 31/64* (2020.01); *H01G 9/21* (2013.01)

(58) Field of Classification Search
CPC ........ G01R 31/016; G01R 31/64; H01G 9/14; H01G 9/21; H01G 13/00
See application file for complete search history.

(56) References Cited

U.S. PATENT DOCUMENTS 6,532,425 B1 * 3/2003 Boost ................. G01R 31/3648
320/136
10,989,762 B2 * 4/2021 Jiang .................... G01R 31/392
(Continued)

FOREIGN PATENT DOCUMENTS

| JP | 11-69834 A | 3/1999 |
| JP | 2000-131362 A | 5/2000 |

(Continued)

OTHER PUBLICATIONS

International Search Report dated Nov. 26, 2019, issued in counterpad International Application No. PCT/JP2019/038070, with English Translation. (5 pages).

(Continued)

*Primary Examiner* — Thang X Le
(74) *Attorney, Agent, or Firm* — WHDA, LLP

(57) ABSTRACT

A method includes processes of (a processing part 8) calculating an estimated heat generation temperature by using drive conditions (22, a storage part 6) at least including drive timing information (18) and drive current value information (20), and temperature change characteristic information (24) of a capacitor, calculating state change information (28) of the capacitor after elapse of a reference time by using the estimated heat generation temperature, and calculating a lifespan estimation value (lifespan estimation result 30) of the capacitor by using the state change information. This enables capacitor lifespan estimation corresponding to fluctuations of a drive current value flowing through the capaci- (Continued)

tor, the applicability of the capacitor is confirmed, and the safety of equipment using the capacitor is improved.

19 Claims, 13 Drawing Sheets

(56) References Cited

U.S. PATENT DOCUMENTS

| | | | | |
|---|---|---|---|---|
| 2003/0185271 | A1* | 10/2003 | Isozumi | G01K 3/04 |
| | | | | 374/45 |
| 2007/0150236 | A1* | 6/2007 | Warizaya | G06F 11/008 |
| | | | | 702/184 |
| 2009/0167541 | A1* | 7/2009 | Dooley | G01R 31/64 |
| | | | | 340/635 |
| 2010/0188099 | A1* | 7/2010 | Paulsen | H01G 13/00 |
| | | | | 324/548 |
| 2014/0103937 | A1 | 4/2014 | Khan et al. | |

FOREIGN PATENT DOCUMENTS

| | | |
|---|---|---|
| JP | 2006-78215 A | 3/2006 |
| JP | 2010-60305 A | 3/2010 |
| JP | 2013-44714 A | 3/2013 |
| JP | 2016-31305 A | 3/2016 |

OTHER PUBLICATIONS

Written Opinion in Japanese of the International Searching Authority (Form PCT/ISA/237) dated Nov. 26, 2019, issued in counterpart International Application No. PCT/JP2019/038070 (6 pages).

3Asperi et al., "Life Prediction Model for Aluminum Electrolytic Capacitors", Industry Applications Society Annual Meeting (IAS), Conference Record of the IEEE, Oct. 6, 1996, vol. 3, pp. 1347-1351. Cited in ISR. (5 pages).

Office Action dated Jun. 7, 2022, issued in counterpart JP application No. 2018-184290, with English translation. (10 pages).

Extended (Supplementary) European Search Report dated Jun. 3, 2022, issued in counterpart EP application No. 19866752.9. (9 pages).

Kim et al., "A calculation of predicting the expected life of super-capacitor following current pattern of railway vehicles", Power Electronics, IEEE, 2007, pp. 978-983, cited in EP Extended European Search Report dated Jun. 3, 2022. (6 pages).

Notification of Transmittal of Copies of Translation of the International Preliminary Report on Patentability (Form PCT/IB/338) issued in counterpart International application No. PCT/JP2019/038070 dated Apr. 8, 2021 with Forms PCT/IB/373 and PCT/ISA/237, with English translation. (19 pages).

\* cited by examiner

FIG. 3

DRIVE CONDITION 22

| STEP | TIMING [SEC] | CURRENT VALUE [Arms] |
|---|---|---|
| 1 | 0 | 0 |
| 2 | 6.815 | 10.71 |
| 3 | 7.133 | 8.46 |
| 4 | 17.6 | 2.52 |
| ⋮ | ⋮ | ⋮ |
| N | TN | IN |

TIMING column: 18
CURRENT VALUE column: 20

FIG. 4

TEMPERATURE CHANGE
CHARACTERISTIC INFORMATION 24

| PRODUCT NAME, SERIES NAME | AAA |
|---|---|
| VOLTAGE [V] | ○○ |
| CAPACITY [uF] | ○○○○ |
| SIZE | XXXX |
| AMBIENT TEMPERATURE [°C] | △△△ |
| TYPE OF ELECTROLYTIC SOLUTION | YYYY |
| ESR [Ω] | △△△△△ |
| $\beta A$ | XXXXX |
| Rth [deg/W] | ○△ |
| Cth [J/deg] | X△ |

FIG. 11
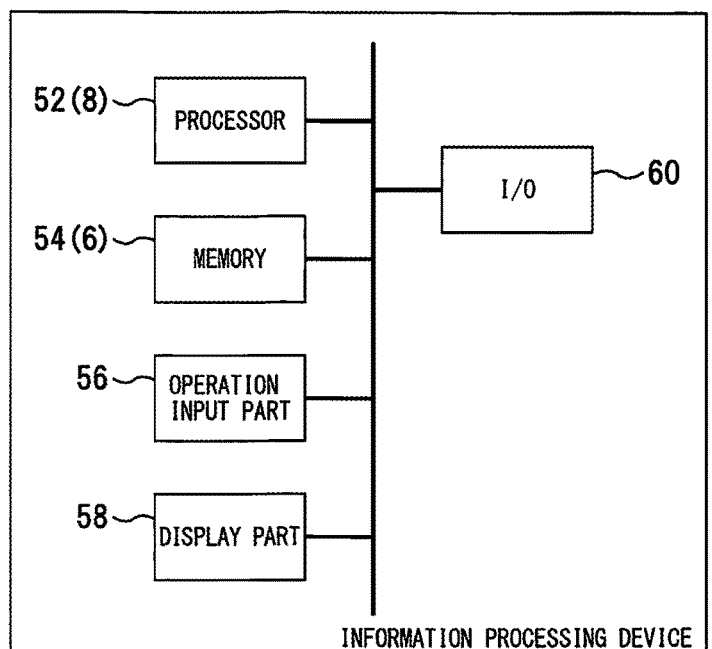
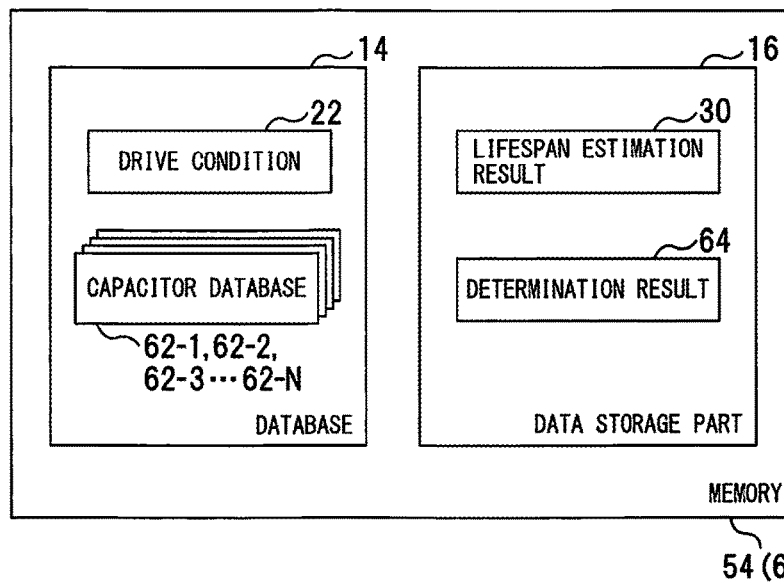

CAPACITOR LIFESPAN ESTIMATION METHOD, LIFESPAN ESTIMATION PROGRAM THEREOF, INFORMATION PROCESSING DEVICE, AND CAPACITOR

TECHNICAL FIELD

The present invention relates to a lifespan estimation technique according to a drive condition of a capacitor.

BACKGROUND ART

A capacitor such as an electrolytic capacitor has a rated current value, so-called rated ripple current value, set in consideration of safety and durability, and a product is designed so that a current value exceeding this rated ripple current value does not flow, or a capacitor corresponding to a desired current value is used. A constant drive current value is continuously superimposed for a long time on an electrolytic capacitor used as a power source for home appliances or industrial equipment.

When a capacitor is selected, an important factor is to grasp a period during which a predetermined performance can be exhibited, i.e., a lifespan, and a technique for determining the lifespan is being studied.

In a lifespan diagnosis of an electrolytic capacitor, for example, an accelerated lifespan test is performed while diffusion acceleration of an electrolytic solution is increased by disposing multiple openings in a case, and changes in weight value and electrostatic capacity are detected to estimate the lifespan of the capacitor (e.g., Patent Literature 1). In another case, a deterioration of an electrolytic capacitor is predicted by utilizing a change in equivalent series resistances (ESR) at a reference time and after the elapse of a predetermined period, a change in an electrolytic solution, etc. (e.g., Patent Literature 2).

CITATION LIST

Patent Literature

Patent Literature 1: Japanese Laid-Open Patent Publication No. 2013-44714
Patent Literature 2: Japanese Laid-Open Patent Publication No. 2006-78215

SUMMARY OF INVENTION

Technical Problem

As to electrolytic capacitors used in EPS (Electric Power Steering) drive circuits or drive circuits for main power motors of vehicles such as automobiles, a drive current several times as large as the rated ripple current value may be superimposed for a few seconds to a few minutes, for example, at the time of a steering wheel operation or switching to another operation. When an electrolytic capacitor is used under such a use condition where the current value fluctuates, an influence on the electrolytic capacitor and a heat generation state are different from when a constant drive current flows, so that the lifespan cannot be calculated based on simple aging etc.

For example, a lifespan of an aluminum electrolytic capacitor is greatly affected by an ambient temperature of the use environment and self-heating due to a drive current. Between these, the self-heating has a problem that a transition status thereof is difficult to grasp since the use conditions of vehicles and equipment equipped with electrolytic capacitors are different, for example.

Furthermore, to grasp the lifespan of the electrolytic capacitor, for example, a technique of reproducing a test machine of a vehicle or equipment to be equipped with the capacitor and actually operating the machine under an assumed drive condition was adopted. This causes a problem that if the use environment of the capacitor is different, an experimental device must be manufactured in accordance with the environment.

Such problems are not disclosed or suggested in Patent Literature 1 and 2, and these problems cannot be solved by the configurations disclosed in Patent Literature 1 and 2.

Therefore, in view of the problem described above, an object of the present invention is to enable lifespan estimation of a capacitor corresponding to fluctuations of a drive current value flowing through the capacitor.

Another object of the present invention is to estimate a state of the capacitor in the case of a high drive current flowing in a short period of time to confirm the applicability of the capacitor and improve the safety of equipment using the capacitor.

Solution to Problem

To achieve the objects, an aspect of a capacitor lifespan estimation method of the present invention includes calculating an estimated heat generation temperature by using drive conditions at least including drive timing information and drive current value information, and temperature change characteristic information of a capacitor, calculating state change information of the capacitor after elapse of a reference time by using the estimated heat generation temperature, and calculating a lifespan estimation value of the capacitor by using the state change information.

The capacitor lifespan estimation method may include calculating an estimated evaporation value of an electrolytic solution of the capacitor in a set drive time by using the state change information of the capacitor and calculating the lifespan estimation value by using the estimated evaporation value and an evaporation reference value of the electrolytic solution.

The capacitor lifespan estimation method may further include calculating a composite lifespan estimation value by using the lifespan estimation value, drive environment temperature information of the capacitor, and rate information of occurrence of the drive environment temperature information and the drive conditions.

In the capacitor lifespan estimation method, the reference time may include a time for applying a drive current to the capacitor and a time until the heat generation temperature of the capacitor becomes equal to or less than a predetermined temperature after stop of the application of the drive current.

The capacitor lifespan estimation method may further include determining whether the calculated lifespan estimation value satisfies a required lifespan condition and using this determination result to generate lifespan determination information including any one or more of the lifespan estimation value, the determination result, and lifespan value improvement information of the capacitor.

To achieve the objects, an aspect of an information processing device of the present invention is an information processing device having a capacitor lifespan estimation function and including: an input part through which drive conditions at least including drive timing information and drive current value information are to be input; a storage part being configured to store the drive conditions and temperature change characteristic information of a capacitor; and a processing part including a heat generation estimation part being configured to calculate an estimated heat generation temperature by using the drive conditions and the temperature change characteristic information, and a lifespan estimation part being configured to calculate state change information of the capacitor after elapse of a reference time by using the estimated heat generation temperature and calculate a lifespan estimation value of the capacitor by using the state change information.

In the information processing device, the lifespan estimation part may calculate an estimated evaporation value of an electrolytic solution of the capacitor in a set drive time by using the state change information of the capacitor and may calculate the lifespan estimation value by using the estimated evaporation value and an evaporation reference value of the electrolytic solution.

In the information processing device, the processing part may calculate a composite lifespan estimation value by using the lifespan estimation value, drive environment temperature information of the capacitor, and rate information of occurrence of the drive environment temperature information and the drive conditions.

In the information processing device, the reference time may include a time for applying a drive current to the capacitor and a time until the heat generation temperature of the capacitor becomes equal to or less than a predetermined temperature after stop of the application of the drive current.

In the information processing device, the processing part may determine whether the calculated lifespan estimation value satisfies a required lifespan condition and may use this determination result to generate lifespan determination information including any one or more of the lifespan estimation value, the determination result, and lifespan value improvement information of the capacitor.

The information processing device may further include a display part, and the processing part may generate, and display on the display part, a lifespan estimation display screen using at least the lifespan estimation value and the drive conditions.

To achieve the objects, an aspect of a capacitor lifespan estimation program of the present invention is a lifespan estimation program for causing a computer to perform a capacitor lifespan estimation process, and the lifespan estimation program for causing the computer to implement functions of: calculating an estimated heat generation temperature by using drive conditions at least including drive timing information and drive current value information, and temperature change characteristic information of a capacitor; calculating state change information of the capacitor after elapse of a reference time by using the estimated heat generation temperature; and calculating a lifespan estimation value of the capacitor by using the state change information.

The lifespan estimation program may include functions of calculating an estimated evaporation value of an electrolytic solution of the capacitor in a set drive time by using the state change information of the capacitor, and calculating the lifespan estimation value by using the estimated evaporation value and an evaporation reference value of the electrolytic solution.

The lifespan estimation program may further include a function of calculating a composite lifespan estimation value by using the lifespan estimation value, drive environment temperature information of the capacitor, and rate information of occurrence of the drive environment temperature information and the drive conditions.

The lifespan estimation program may further include functions of determining whether the calculated lifespan estimation value satisfies a required lifespan condition, and using this determination result to generate lifespan determination information including any one or more of the lifespan estimation value, the determination result, and lifespan value improvement information of the capacitor.

To achieve the objects, an aspect of a capacitor of the present invention is designed by using lifespan estimation value information calculated by the capacitor lifespan estimation method.

To achieve the objects, in an aspect of the capacitor of the present invention, lifespan estimation value information calculated by the capacitor lifespan estimation method is attached.

Advantageous Effects of Invention

According to the present invention, any of the following effects can be expected.

(1) A transition of self-heating of the capacitor to a changing drive current value can be analyzed.

(2) By analyzing the transition of the self-heating of the capacitor, the lifespan of the capacitor can be estimated in a state close to a drive state of a vehicle or equipment.

(3) A state of the capacitor and an influence can be estimated in the case of a drive current equal to or greater than the rated value flowing in a short period of time.

(4) A transient state change of the capacitor due to the current fluctuation can be analyzed to grasp the limit condition of the capacitor and expand the usability and selectivity of the capacitor.

Other objects, features, and advantages of the present invention will become more apparent by reference to the accompanying drawings and embodiments.

BRIEF DESCRIPTION OF DRAWINGS

FIG. 3 is a diagram showing an example of a drive condition.

FIG. 4 is a diagram showing an example of temperature change characteristic information.

FIG. 11 shows a hardware configuration example of an information processing device according to a third embodiment.

DESCRIPTION OF EMBODIMENTS

First Embodiment

Figure 1:
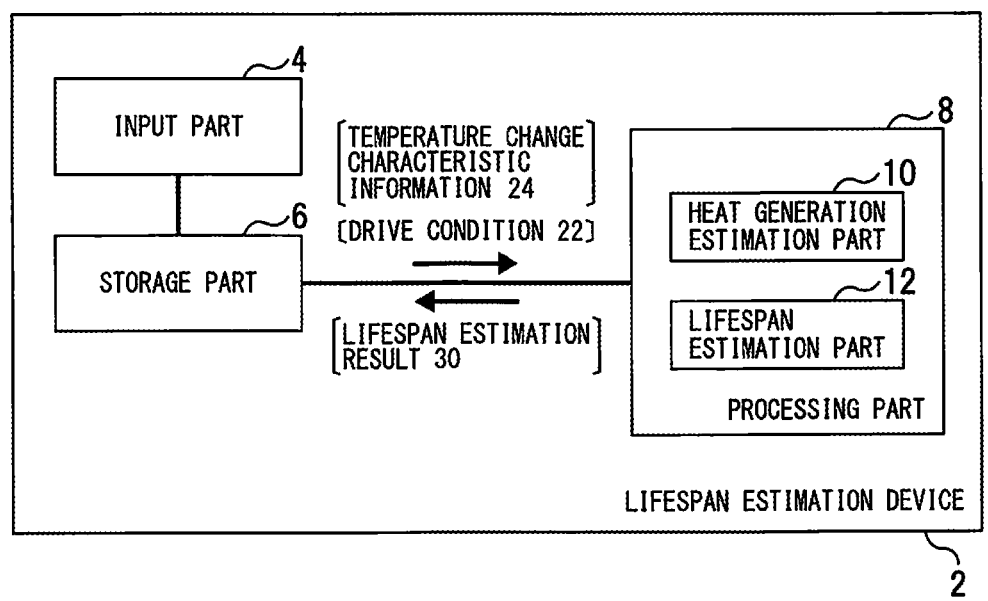
FIG. 1 is a diagram showing a configuration example of a capacitor lifespan estimation device according to a first embodiment.

FIG. 1 shows a configuration example of a capacitor lifespan estimation device according to a first embodiment. The configuration shown in FIG. 1 is an example, and the present invention is not limited to this configuration.

This lifespan estimation device 2 is an example of capacitor lifespan estimation means using a computer for calculation and estimates a lifespan of a capacitor by analyzing a heat generation transition of the capacitor caused by a fluctuating drive current value of the capacitor. The capacitor subjected to the lifespan estimation is, for example, an electrolytic capacitor formed by putting a capacitor element obtained by winding electrode foils and separators and an electrolytic solution into a bottomed tubular outer case and sealing an opening portion of the bottomed tubular outer case with a sealing plate.

Therefore, for example, as shown in FIG. 1, the lifespan estimation device 2 includes an input part 4, a storage part 6, and a processing part 8.

The input part 4 is an example of information input means for the lifespan estimation device 2, and for example, information on a capacitor to be estimated for lifespan and information such as a drive condition for operating the capacitor are input through the input part 4. The input part 4 may be, for example, an operation key or a mouse operated by an operator of the lifespan estimation device 2, or means for accepting a storage medium in which capacitor information, a drive condition, etc. are stored and reading the information, or may take in information necessary for the lifespan estimation through communication with an external device via a network.

The storage part 6 is an example of means for storing information used for a lifespan estimation process and storing a calculated lifespan estimation result. The storage part 6 is connected to the input part 4, for example, and stores input temperature change characteristic information and a drive condition of the capacitor. Additionally, the storage part 6 may store a lifespan estimation program etc. used in the lifespan estimation process.

The processing part 8 is an example of calculation means executing a lifespan estimation program to execute a capacitor lifespan analysis process and includes a heat generation estimation part 10 and a lifespan estimation part 12, for example. The heat generation estimation part 10 is an example of a functional part calculating an estimated heat generation temperature of the capacitor by using the drive condition and the temperature change characteristic information of the capacitor. The lifespan estimation part 12 is an example of means for calculating a capacitor lifespan estimation value in the case of driving based on the drive condition by using the heat generation temperature of the capacitor calculated by the heat generation estimation part 10.

Capacitors have electrical characteristics such as electrostatic capacity, equivalent series resistance (ESR), dielectric loss tangent (tan δ), and leakage current of the capacitors, and the electrical characteristics change due to evaporation of the electrolytic solution enclosed inside depending on temperature and aging. In a capacitor lifespan estimation process, the self-heating value based on the drive condition and the evaporation amount of the electrolytic solution based on the self-heating value are analyzed to determine that the life expires when the electrical characteristics of the capacitor exceed predetermined criteria.

Figure 2:
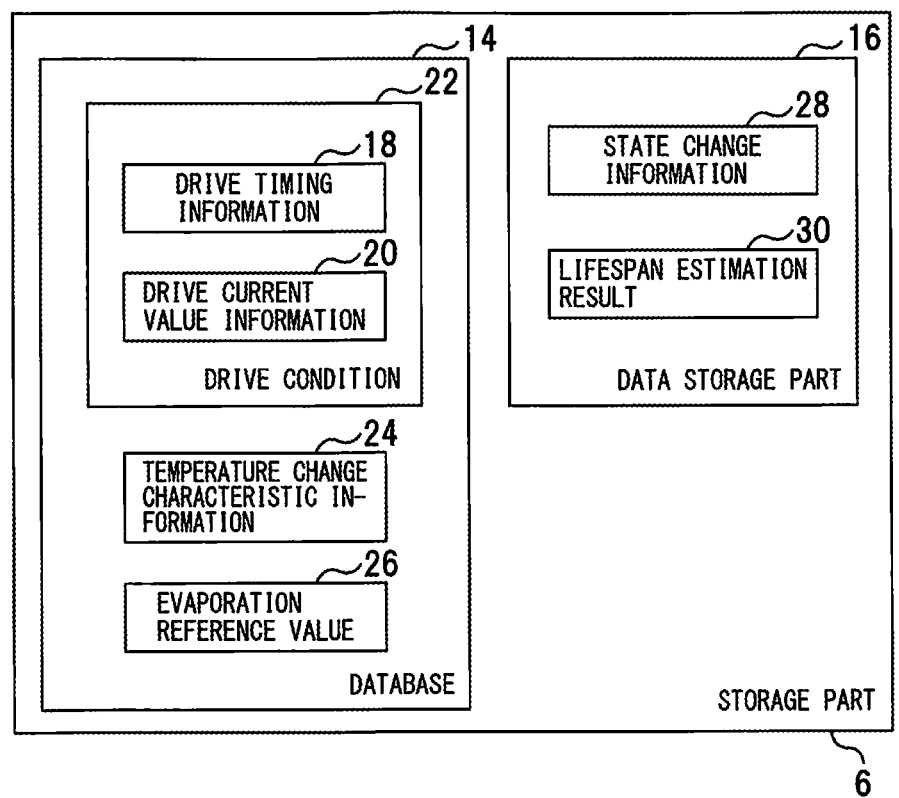
FIG. 2 is a diagram showing a configuration example of a storage part.

FIG. 2 shows a configuration example of the storage part.

As shown in FIG. 2, the storage part 6 includes a database 14 storing information used for lifespan estimation and a data storage part 16 storing information calculated by the lifespan estimation process. For example, the database 14 stores drive timing information 18 and drive current value information 20 as a drive condition 22. The drive condition 22 is an example of condition information for operating the capacitor and is sectionalized by a predetermined time from the start timing of the capacitor as shown in FIG. 3, for example. In the drive current value information 20, a drive current value is set for each timing sectionalized in the drive timing information. As described above, the drive condition 22 is a schedule of the current value flowing through the capacitor.

Additionally, the database 14 stores temperature change characteristic information 24 and an evaporation reference value 26. The temperature change characteristic information 24 is an example of information including a change state of an element center temperature in a heat generation state of the capacitor and a transient characteristic of this change. The temperature change characteristic information 24 is used, for example, in a heat generation simulation for estimating a transition state of the self-heating of the capacitor due to a fluctuation of the drive current value and a change in evaporation of the electrolytic solution due to the self-heating. For example, as shown in FIG. 4, the temperature change characteristic information 24 includes a product name, a series name, a rated voltage value, an electrostatic capacity, a size, an ambient temperature, a type of an electrolytic solution, an equivalent series resistance, and a heat dissipation coefficient (βA), a thermal resistance (Rth), and a thermal capacity (Cth) of the capacitor, etc.

The evaporation reference value 26 is a reference value for deterioration of the capacitor characteristics caused by evaporation of the electrolytic solution and is an example of reference information indicative of the capacitor lifespan. Therefore, when the evaporation reference value 26 is exceeded due to the evaporation of the electrolytic solution of the capacitor, it is determined that the life of the capacitor has expired.

The data storage part 16 stores capacitor state change information 28 calculated by using the drive condition and a lifespan estimation result 30 calculated by the lifespan estimation process. The lifespan estimation result 30 is an example of a lifespan estimation value of the present invention. The lifespan estimation result 30 may be associated with the capacitor information stored in the storage part 6 for the capacitor subjected to the lifespan estimation process, for example.

<Heat Generation Simulation Process>

An example of a heat generation simulation process for estimating the heat generation state of the capacitor will be described.

For example, the following calculation method can be used in the heat generation simulation of the capacitor when the drive current value is steady.

[Math. 1]

$$\Delta T_{(t=\infty)} = (I^2 \times ESR)/\beta A \quad (1)$$

In Eq. (1), ΔT is an element center temperature, I is a drive current value, ESR is an equivalent series resistance value, and βA is a heat dissipation coefficient. Among these, ESR and βA are unique information according to the size of the capacitor etc.

This heat dissipation coefficient βA is expressed by Eq. (2).

[Math. 2]

$$\beta A = 1/Rth \quad (2)$$

Rth is a thermal resistance and is a value indicative of a degree of difficulty of heat rise due to heat generation of the capacitor.

By combining Eqs. (1) and (2), the following equation (3) is obtained.

[Math. 3]

$$\Delta T_{(t=\infty)} = (Rth \times I^2 \times ESR) \quad (3)$$

Eq. (3) is used for the heat generation simulation in the case of the steady state of the drive current value, and Eq. (4) is used in the case taking a change with time into consideration.

[Math. 4]

$$\Delta T_{(t)} = (Rth \times I_{(t)}^2 \times ESR)(1 - e^{(-t/Rth \times Cth)}) \quad (4)$$

Cth is a thermal capacity and is a value indicative of a degree of difficulty of cooling heat caused by heat generation of the capacitor. ΔT(t) indicates the element center temperature after an elapsed time t. Eq. (4) is used for calculating the element center temperature after elapsed time t and is therefore converted to Eq. (5) in consideration of whether the temperature has increased or decreased due to self-heating.

[Math. 5]

$$\Delta T_{(t)} = \Delta Tx + ((Rth \times I_{(t)}^2 \times ESR) - \Delta Tx)(1 - e^{(-t/(Rth \times Cth))}) \quad (5)$$

The analysis of the thermal resistance Rth and the thermal capacity Cth will be described.

The thermal resistance Rth can be obtained by using a heat generation calculation equation in the case of the steady state of the drive current value of the capacitor, for example. Specifically, Eq. (6) obtained by transforming Eq. (1) is used.

[Math. 6]

$$Rth = \frac{\Delta T}{I^2 rms \times ESR} \quad (6)$$

Data used for ΔT of Eq. (6) is obtained by measuring a heat generation temperature when a constant current is applied as the drive current value of the capacitor or is data measured in advance.

The thermal capacity Cth can be calculated by using Eq. (7), for example.

[Math. 7]

$$Cth = \frac{\tau}{Rth} \quad (7)$$

Figure 5:
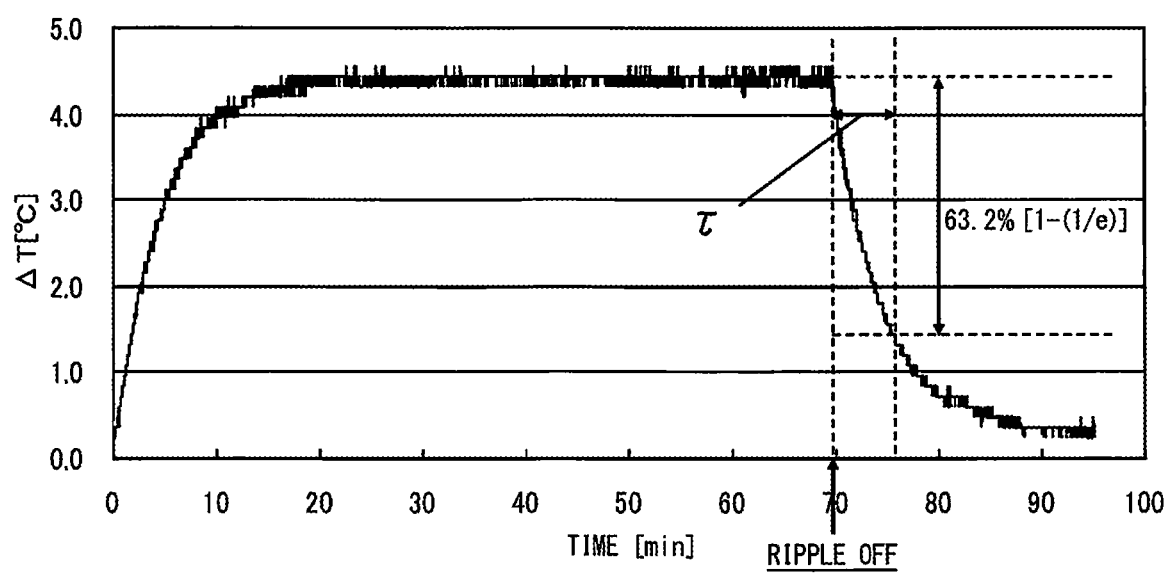
FIG. 5 is a graph showing an example of the analysis principle of the temperature change characteristic information.

As shown in Eq. (7), the thermal capacity Cth is inversely proportional to the thermal resistance Rth. In Eq. (7), τ is a thermal time constant for the heat generation of the capacitor. For example, as shown in FIG. 5, the thermal time constant τ is a time required for a temperature difference between a final reached temperature during superimposition of the drive current (the temperature when ripple is OFF) and an initial temperature of the capacitor to decrease by 63.2[%], i.e. 1−(1/e).

As described above, the thermal capacity Cth, the thermal resistance Rth, and the thermal time constant τ of the capacitor are values indicative of the transient characteristics of the temperature change due to the heat generation of the capacitor and are examples of the temperature change characteristic information of the present invention.

The calculation of the thermal capacity Cth, the thermal resistance Rth, and the thermal time constant τ for heat generation, or the calculation of the heat generation transition using these, is not limited to calculation using values obtained from experiments by actually applying a current to the capacitor and may be performed by using values obtained by a simulation program such as SPICE (Simulation Program with integrated Circuit Emphasis) used for calculating an amount of heat generation of an electronic circuit.

The heat generation estimation part 10 of the lifespan estimation device 2 calculates the transition of the self-heating temperature due to drive of the capacitor by using the drive condition and the temperature change characteristic information based on Eq. (5).

<Lifespan Estimation Process>

The capacitor lifespan estimation process will be described.

The lifespan estimation part 12 uses, for example, Eq. (8) to calculate the evaporation amount of the electrolytic solution in the case of driving at a reference time. The calculated evaporation amount of the electrolytic solution is an example of the state change information of the present invention.

[Math. 8]

$$W_t(t) = W_s(T_a) * K_1^{\left(\frac{\Delta T(t)}{K_2}\right)} \quad (8)$$

Wt(t) is an electrolytic solution evaporation amount in a predetermined period, Ws is an electrolytic solution evaporation amount under ambient temperature, Ta is the ambient temperature, and K1 and K2 are temperature accelerations. In Eq. (8), ΔT(t) is a change temperature due to self-heating calculated by the heat generation simulation.

The reference time t used for calculating the electrolytic solution evaporation amount Wt(t) includes a time of application of a current value to the capacitor according to the drive condition, and a time until the heat generation temperature of the capacitor element decreases and becomes stable after the application of the current value is completed. The stability of the heat generation temperature means a state in which the heat generation temperature of the capacitor is a predetermined value, for example, 3[° C.] or less, more preferably 1[° C.] or less, from the information obtained by the heat generation simulation or experiments in advance. Therefore, in the calculation of the electrolytic solution evaporation amount Wt(t), the evaporation of the electrolytic solution during decrease in the heat generation temperature after cutting the drive current is taken into consideration in addition to the heat generation state of the capacitor based on the drive condition.

The electrolytic solution of the capacitor evaporates due to the ambient temperature Ta in addition to the self-heating associated with driving. Therefore, in Eq. (8), the amount of evaporation of the electrolytic solution based on the ambient temperature is taken into consideration. The term of temperature acceleration K1 on the right side is an acceleration due to temperature and defines a degree of change in the evaporation amount in temporal transition with respect to self-heating. The temperature accelerations K1, K2 are estimation equations using, for example, the Arrhenius law and may have values set depending on a type of electrolytic solution or electrode foil. The term of the acceleration due to temperature is, for example, a temperature acceleration having a rate of the temperature change ΔT(t) due to self-heating and the temperature acceleration K2 as the exponent and the temperature acceleration K1 as the base. For example, in the case of K1=2 and K2=7 0.5, when the temperature change ΔT(t) due to self-heating decreases by 7.5° C., electrolytic solution evaporation amount Wt(t) becomes smaller and the lifespan of the capacitor is doubled.

The evaporation value is calculated by integrating the electrolytic solution evaporation amount Wt(t) with respect to Eq. (8). This calculation equation is Eq. (9).

[Math. 9]

$$W(T) = \int_0^T W_t(t)dt \quad (9)$$

T indicates, as a set drive time, for example, a total time of a drive timing set in one cycle of the drive condition. The calculated evaporation value in one cycle is an example of the estimated evaporation value of the present invention.

This drive time may be set based on, for example, actual use conditions, may be the time of one cycle of a profile repeated multiple times, or may be a total time of a current profile repeated multiple times.

Eq. (10) is used to calculate the estimated lifetime.

[Math. 10]

$$L_x = [W_o/W(T)]*T \quad (10)$$

In Eq. (10), Wo is an evaporation reference value of the electrolytic solution set as the lifespan of the capacitor. In this equation (10), a rate of the evaporation value of the electrolytic solution changed by one cycle of driving to the evaporation reference value Wo is calculated, and the reciprocal of this rate is multiplied by the time of one cycle so as to calculate a lifespan estimation value (time) Lx at which an evaporation value reaches to the evaporation reference value Wo in the case that the capacitor is driven with this current profile.

[Math. 10]

$$L_x = [W_o/W(T)]*T \quad (10)$$

Figure 6:
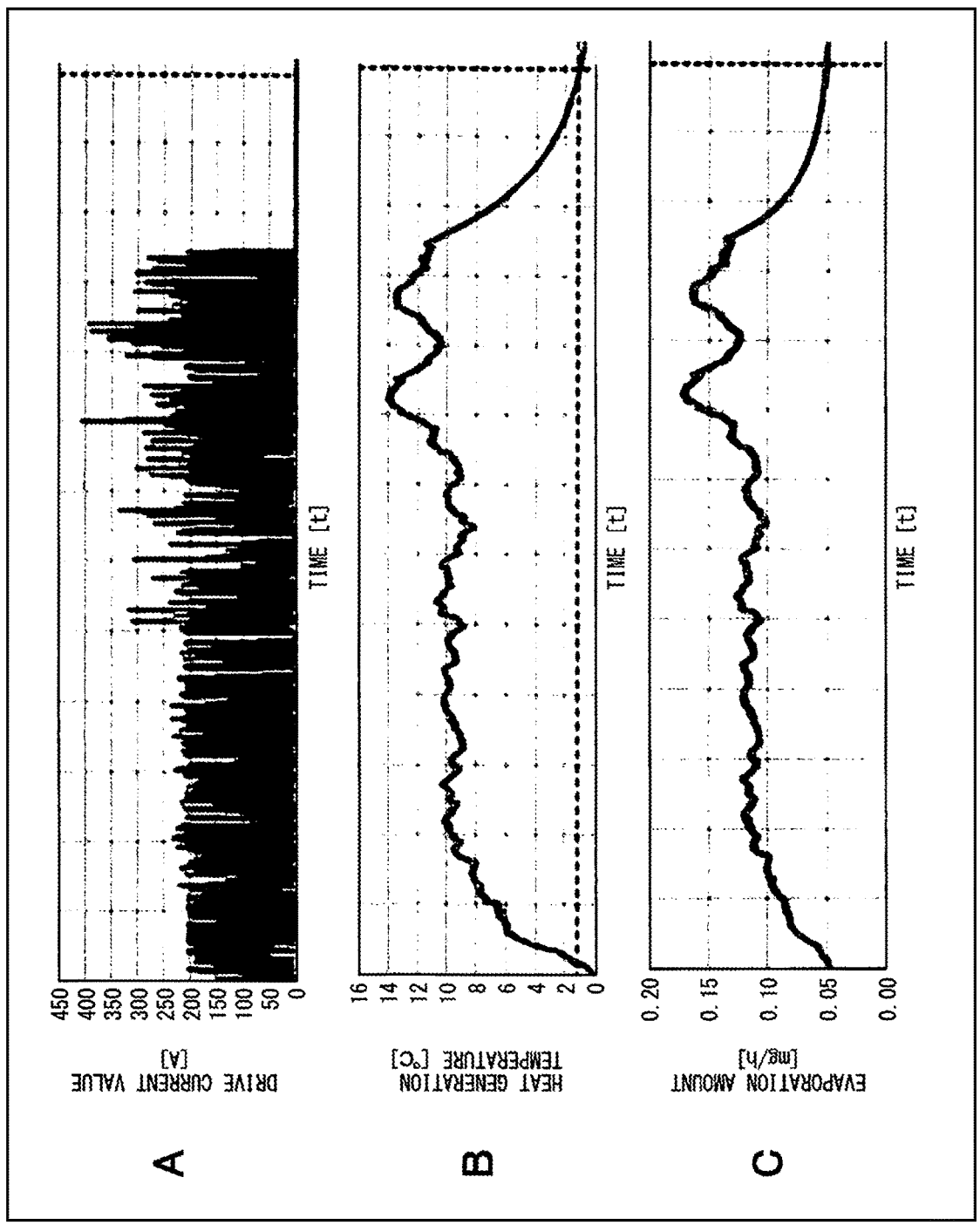
FIG. 6 is (A) a graph showing an example of a drive condition, (B) a graph showing an example of an estimated amount of heat generation at a reference time calculated based on the drive condition, and (C) a graph showing an example of an evaporation amount of an electrolytic solution at a reference time calculated based on the estimated amount of heat generation.

FIG. 6 is a diagram showing an example of a data conversion state according to a calculation process of the lifespan estimation value Lx based on the drive condition. The configuration shown in FIG. 6 is an example.

In the lifespan estimation process, for example, as shown in A of FIG. 6 and B of FIG. 6, a heat generation simulation is performed for the drive condition of the capacitor, and an estimated heat generation temperature (B of FIG. 6) corresponding to a change in drive current value I (A of FIG. 6) is calculated.

In the lifespan estimation process, an estimated heat generation value is used to calculate an evaporation amount per unit time (C of FIG. 6).

For the calculated evaporation amount per unit time, the lifespan estimation value (time) at which the evaporation value reaches to the evaporation reference value Wo set in advance or obtained by an experiment is calculated.

<Capacitor Lifespan Estimation Process>

Figure 7:
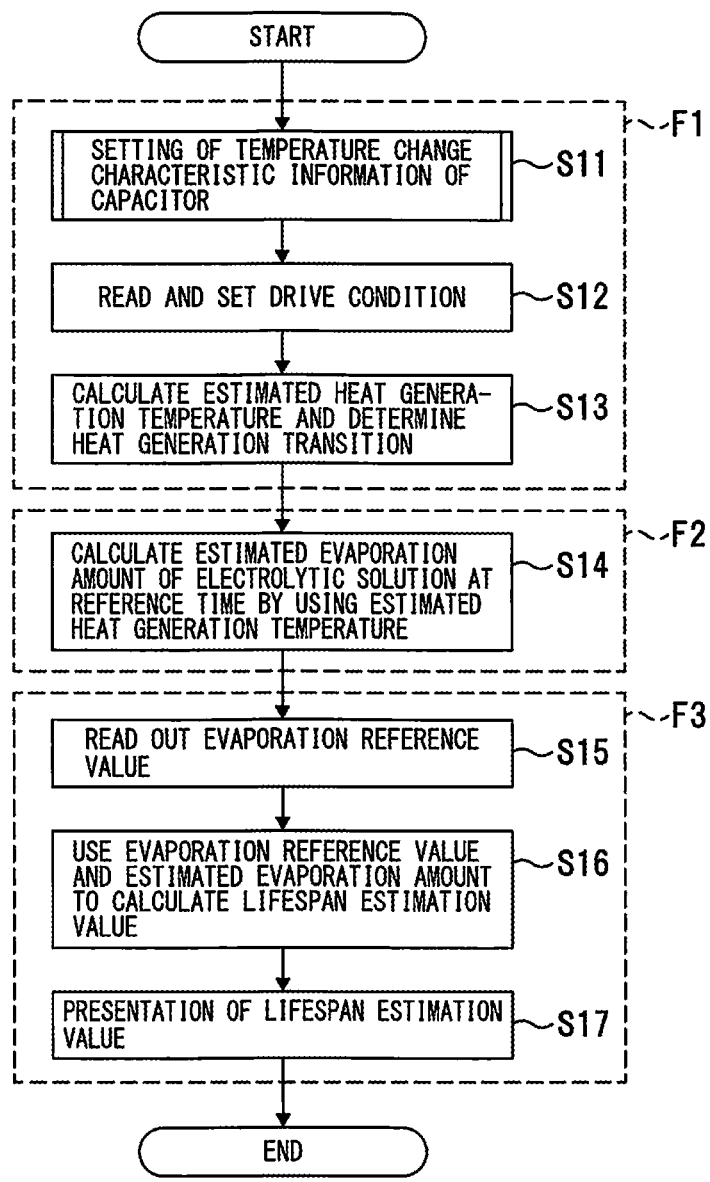
FIG. 7 is a flowchart showing an example of a capacitor lifespan estimation process.

FIG. 7 shows an example of a capacitor lifespan estimation process. The lifespan estimation process shown in FIG. 7 is an example of a capacitor lifespan estimation method or a lifespan estimation program of the present invention, and the present invention is not limited to these process contents or process procedures.

For a heat generation estimation process (F1), the processing part 8 sets the temperature change characteristic information of the capacitor (S11), reads the drive condition, and sets the drive condition in the heat generation estimation part 10 (S12). The estimated heat generation temperature is calculated to determine a heat generation transition (S13). The temperature change characteristic information of the capacitor may be, for example, preset information read from the storage part 6 or read from an external database etc. through the input part 4, or measured temperature of the capacitor subjected to the lifespan estimation when a predetermined drive current value is applied to the capacitor may be used for the temperature change characteristic information of the capacitor.

For a calculation process (F2) of the state change information of the capacitor, the processing part 8 calculates an estimated evaporation amount of the electrolytic solution at the reference time by using the calculated estimated heat generation temperature (S14). This process includes obtaining an amount of the electrolytic solution evaporated in the time obtained by combining the drive time of one cycle set in the current profile for the drive condition and the time until the heat generation temperature reaches a predetermined temperature or less after the current is turned off.

For the lifespan estimation process (F3), the processing part 8 reads out the evaporation reference value Wo indicative of the lifespan of the capacitor from the storage part (S15) and uses the calculated estimated evaporation amount of one cycle and the evaporation reference value Wo to calculate the lifespan estimation value (S16).

The processing part 8 presents the lifespan estimation value by using, for example, a display screen or voice (S17). The presentation of the lifespan estimation value may be displayed on a display part 58 of an information processing device 50, for example, or may be added as lifespan estimation value information to a surface or a package of a capacitor that is a product subjected to the lifespan estimation process, specifications or catalogs related to the capacitor, or data presented to customers.

Effect of the First Embodiment

According to the configuration, the following effects can be expected.

(1) Since the heat generation state is estimated by using the temperature change characteristic information with consideration given to the thermal resistance Rth, the thermal capacity Cth, and the time factor according to the thermal time constant τ, the temperature state of the capacitor in the case of a high drive current flowing in a short period of time can be estimated.

(2) By considering the temperature change characteristics of the capacitor element in terms of the self-heating of the capacitor due to fluctuation of the drive current, the accuracy of lifespan estimation of the capacitor is improved for an operating state of a vehicle or equipment equipped with the capacitor.

(3) The heat generation state of the capacitor corresponding to an assumed drive condition of the capacitor is easily grasped.

(4) A state of the capacitor and an influence can be estimated in the case of a drive current equal to or greater than the rated value flowing in a short period of time.

(5) A transient state change of the capacitor due to the current fluctuation can be analyzed to grasp the limit condition of the capacitor and expand the usability and selectivity of the capacitor.

Second Embodiment

Figure 8:
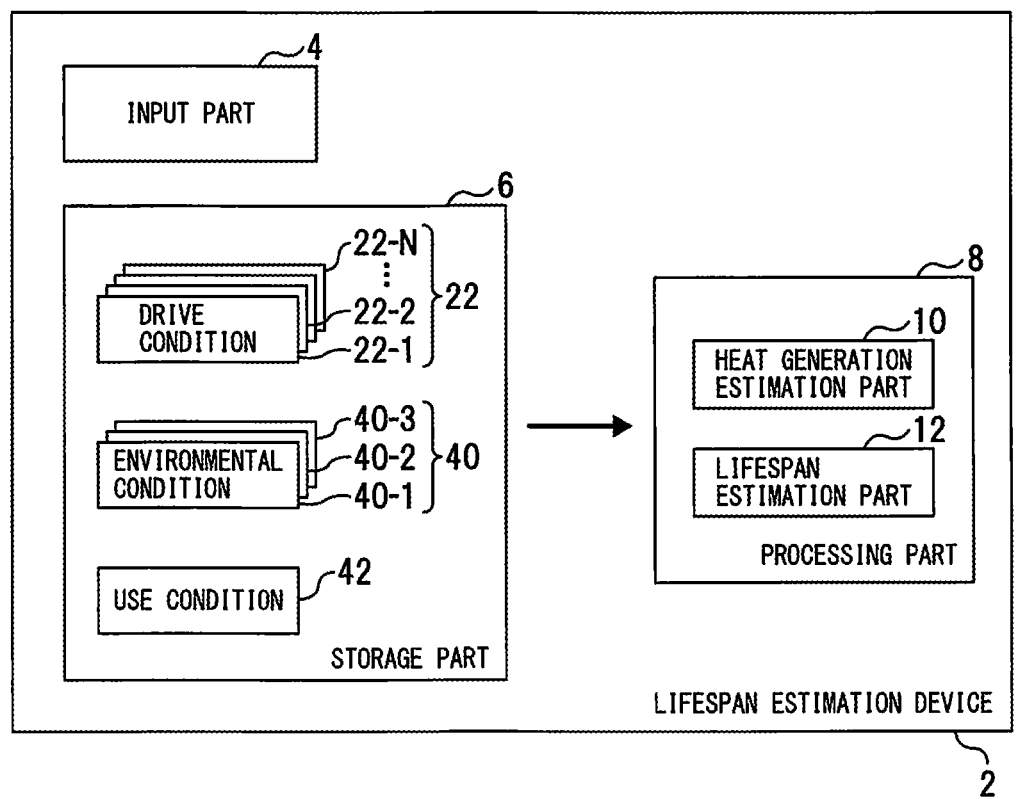
FIG. 8 is a diagram showing a configuration example of a capacitor lifespan estimation device according to a second embodiment.

FIG. 8 shows a configuration example of a capacitor lifespan estimation device according to a second embodiment. The configuration shown in FIG. 8 is an example, and the present invention is not limited to this configuration. In FIG. 8, the same constituent elements as FIG. 1 are denoted by the same reference signs.

In this embodiment, description will be made of lifespan estimation when the capacitor is operated under multiple drive conditions. In the lifespan estimation device 2, for example, as shown in FIG. 8, multiple drive conditions 22-1, 22-2, . . . 22-N, environmental conditions 40, and a use condition 42 are stored in the storage part 6.

The drive conditions 22-1, 22-2, . . . 22-N are current profiles (ED1, ED2, . . . EDN) each including set drive timing information and drive current value information, and total times and reference times of drive timings may be set to the same values among the current profiles or may be different from each other.

The environmental conditions 40 are an example of conditions of a surrounding environment in which the capacitor is operated, and the multiple environmental conditions 40-1, 40-2, and 40-3 are set. The number of the set environmental conditions 40 may be the same as or different from that of the drive conditions 22.

Figure 9:
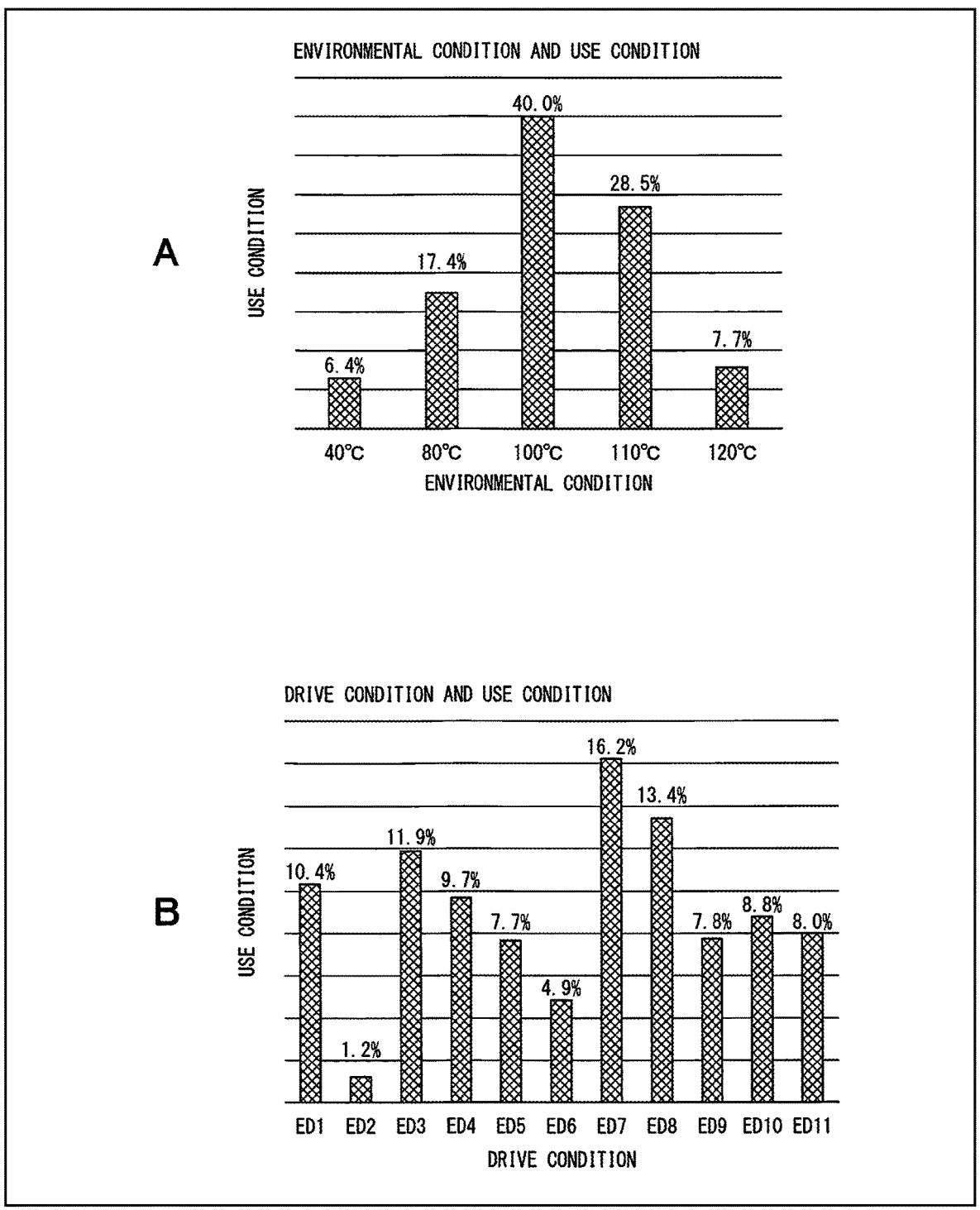
FIG. 9 is (A) a graph showing examples of environmental conditions and use conditions and (B) a graph showing examples of capacitor drive conditions and use conditions.

The use condition 42 is an example of a condition indicative of a use rate of the capacitor under the drive conditions and the environmental conditions. Specifically, in the use condition 42, for example, as shown in A of FIG. 9, the use rate is set for multiple environmental conditions under which the capacitor is assumed to be used in the lifespan estimation of the capacitor. In this figure, for example, five patterns are shown as the environmental conditions, which are the use rate of 6.4[%] at 40[° C.], the use rate of 17.4[%] at 80[° C.], the use rate of 40.0[%] at 100[° C.], the use rate of 28.5[%] at 110[° C.], and the use rate of 7.7[%] at 120[° C.]. In the use condition 42, for example, as shown in B of FIG. 9, a use rate of each drive condition is set in a drive schedule (drive cycle) set by combining the current profiles (ED1 to ED11), which are multiple drive conditions. In the case shown in this figure, for example, the use rate for the current profile ED1 is 10.4[%]; the use rate for the current profile ED2 is 1.2[%]; the use rate for the current profile ED3 is 11.9[%]; the use rate for the current profile ED4 is 9.7[%]; the use rate for the current profile ED5 is 7.7[%]; the use rate for the current profile ED6 is 4.9[%]; the use rate for the current profile ED7 is 16.2[%]; the use rate for the current profile ED8 is 13.4[%]; the use rate for the current profile ED5 is 7.8[%]; the use rate for the current profile ED10 is 8.8[%]; and the use rate for the current profile ED11 is 8.0[%].

The processing part 8 reads a portion or all of the drive conditions 22, the environmental conditions 40, and the use condition 42 from the storage part 6 and performs the heat generation estimation process and the lifespan estimation process of the capacitor when multiple conditions are combined.

<Lifespan Estimation Process when Multiple Conditions are Combined>

A calculation process of a composite lifespan estimation value will be described. This composite lifespan estimation value is a lifespan estimation value calculated by combining multiple drive conditions and their use rates or a lifespan estimation value obtained by combining this lifespan estimation value with a use rate corresponding to an environmental temperature.

First, a lifetime of a drive cycle obtained by combining multiple drive conditions is calculated.

As described in the first embodiment, the lifespan estimation value in the case of operating the capacitor under each of the drive conditions (current profiles ED1 to ED11) is calculated, and the lifespan estimation value in the case of combining multiple drive conditions is calculated by using the calculation results.

In this description, the so-called Miner's rule is used for a calculation process of the composite lifespan estimation value for a periodic load. In the Miner's rule, Eq. (11) is used.

[Math. 11]

$$\frac{1}{Lcycle} = \sum_{m=1}^{m} \frac{Rm}{Lm} \quad (11)$$

In Eq. (11), "Lcycle" is a lifespan estimation value when all the drive conditions (current profiles ED1 to ED11) are combined, and Lm is a lifespan estimation value calculated based on each of the drive conditions. Rm is a use rate set as the use condition.

<Lifespan Estimation Value when Drive Conditions are Combined>

Therefore, by using Eq. (11), a lifespan estimation value is calculated by combining all the drive conditions for each environmental temperature. This environmental temperature is an example of the drive environment temperature information of the present invention. The values of the calculation results shown below are examples.

$$1/Lcycle(40° C.)=0.104/L(ED1)+ \\ 0.012/L(ED2)+ \ldots =1/810448 \text{ [hours]} \quad \text{a)}$$

$$1/Lcycle(80° C.)=0.104/L(ED1)+ \\ 0.012/L(ED2)+ \ldots =1/70932 \text{ [hours]} \quad \text{b)}$$

$$1/Lcycle(100° C.)=0.104/L(ED1)+ \\ 0.012/L(ED2)+ \ldots =1/17913 \text{ [hours]} \quad \text{c)}$$

$$1/Lcycle(110° C.)=0.104/L(ED1)+ \\ 0.012/L(ED2)+ \ldots =1/9866 \text{ [hours]} \quad \text{d)}$$

$$1/Lcycle(120° C.)=0.104/L(ED1)+ \\ 0.012/L(ED2)+ \ldots =1/5288 \text{ [hours]} \quad \text{e)}$$

As described in the first embodiment, in the capacitor lifespan estimation process, the lifespan estimation value is calculated by using the self-heating temperature and the environmental temperature. Therefore, as in a) to e) described above, the lifespan estimation value at each ambient temperature is different.

<Lifespan Estimation Value with Environmental Conditions Taken into Consideration>

For the lifespan estimation value obtained by combining the drive conditions, a lifespan estimation value is calculated with the use rate of the environmental condition taken into consideration. The Miner's rule (Eq. (11)) is also used in this calculation process. The calculation process is represented by Eq. (12).

[Math. 12]

$$Lcomb = \frac{1}{\frac{0.064}{810448} + \frac{0.174}{70932} + \frac{0.400}{17913} + \frac{0.285}{9866} + \frac{0.077}{5288}} \approx 14{,}600 \text{ Hrs} \quad (12)$$

In this equation, "Lcomb" denotes a composite lifespan estimation value with all the drive conditions and environmental conditions taken into consideration.

The calculation technique of the composite lifespan estimation value combining multiple drive conditions and environmental conditions is not limited to those using the Miner's rule, and a calculation technique of an average value taking a use rate into consideration may be used for multiple values.

<Capacitor Lifespan Estimation Process>

Figure 10:
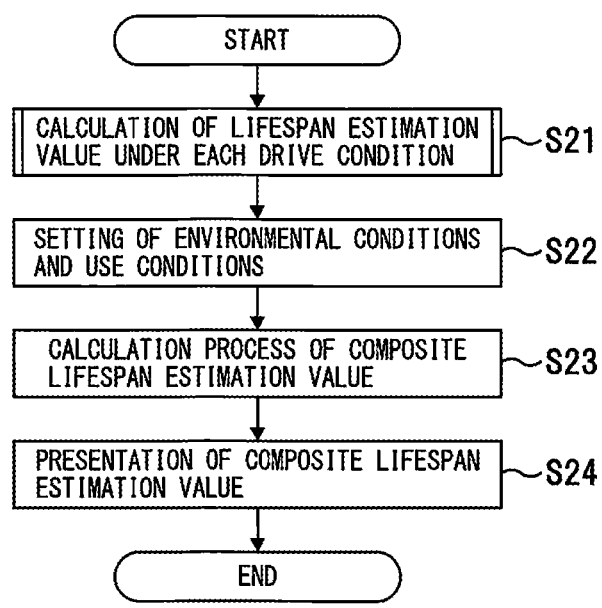
FIG. 10 is a flowchart showing an example of a capacitor lifespan estimation process.

FIG. 10 shows an example of a capacitor lifespan estimation process. The lifespan estimation process shown in FIG. 10 is an example of the capacitor lifespan estimation method or the lifespan estimation program of the present invention, and the present invention is not limited to these process contents or process procedures.

The processing part 8 performs a calculation process of a lifespan estimation value under each of the drive conditions (current profiles ED1 to ED11) (S21). In the calculation process of the lifespan estimation value, as shown in the first embodiment described above, the calculation (heat generation simulation) process (F1) of the estimated heat generation temperature of the capacitor using the drive condition and the temperature change characteristic information is performed, and the electrolytic solution evaporation amount in the reference time is calculated (F2) as the state change information of the capacitor from the calculated estimated heat generation temperature. The lifespan estimation process is then performed to calculate the lifespan estimation value at which the evaporation value reaches to the evaporation reference value Wo (F3). As a result, the lifespan estimation values are stored in the lifespan estimation device 2 to the number of the set drive conditions, for example.

The processing part 8 then sets the environmental conditions and the use conditions (S22). The environmental conditions and the use conditions may be read and set from the storage part 6. Alternatively, the environmental conditions and the use conditions may be input through the input part 4 or may be read from an external database not shown.

In this lifespan estimation process, if the capacitor is used in a single environmental condition, only the use conditions for the drive conditions may be set.

A composite lifespan estimation value is calculated by using the multiple drive conditions, environmental conditions, and the use conditions thereof (S23), and the calculated composite lifespan estimation value is presented by using the display part etc. (S24). This composite lifespan estimation value may be added as the lifespan estimation value information to, for example, a surface or a package of a capacitor that is a product subjected to the lifespan estimation process, specifications or catalogs related to the capacitor, or data presented to customers.

Effect of the Second Embodiment

According to the configuration, the following effects can be obtained.

(1) The lifespan estimation process can be obtained on the assumption that the capacitor is used under multiple drive conditions.

(2) In the case of being mounted on equipment associated with movement such as a vehicle, the capacitor lifespan can be estimated in consideration of the conditions of the changing surrounding environment of the capacitor, so that the lifespan estimation close to the actual usage state can be performed.

(3) By setting a frequency of use for multiple drive conditions and estimating the lifespan, lifespan can be analyzed in terms of capacitor performance durability for fluctuating operating conditions etc., and an accuracy of capacitor selection according to drive conditions can be improved.

Third Embodiment

FIG. 11 shows a configuration example of an information processing device according to a third embodiment. The configuration shown in FIG. 11 is an example.

The information processing device 50 is an example of a capacitor lifespan estimation device of the present invention and may include, for example, a function of calculating a capacitor lifespan estimation value based on a set drive condition and a function of determining whether a required lifespan criterion is satisfied based on the calculated lifespan estimation value. The information processing device 50 has a capacitor selection function using the result of this determination function, a customization function of parts constituting the capacitor, or an advice function related to the use of the capacitor and product selection for customers. The information processing device 50 constitutes a computer as shown in A of FIG. 11, for example, and includes a processor 52, a memory 54, an operation input part 56, a display part 58, and an input/output part (I/O) 60.

The processor 52 is an example of calculation means of a program executed by the information processing device 50 and performs calculation processes of a capacitor lifespan estimation program in addition to an OS (Operating System) providing basic operation control. The processor 52 functions as the processing part 8 of the present invention by executing the lifespan estimation program and may generate a screen showing the heat generation state of the capacitor and a lifespan estimation display screen in addition to performing the heat generation simulation, the lifespan estimation process, and the composite lifespan estimation value calculation process.

The memory 54 includes a ROM (Read Only Memory) and a RAM (Random Access Memory), for example, and constitutes a storage part of the present invention.

The memory 54 stores the OS and the lifespan estimation program and, for example, as shown in FIG. 11B, also stores the drive condition 22, i.e., the current value applied to the capacitor and the addition timing thereof, and capacitor databases 62-1, 62-2, 62-3 . . . 62-N in which performances of multiple capacitors etc. are stored. The capacitor databases 62-1, 62-2, 62-3 . . . 62-N store, for example, information such as the performance of each of capacitors assembled based on electrostatic capacity, specification environment, shape, size, etc., the temperature change characteristic information 24 and the evaporation reference value 26, as well as performances of components such as foils, electrolytic solutions, and cases constituting the capacitors for each type such as material and size. The memory 54 includes a data storage part 16 and stores a calculated lifespan estimation result 30, together with a determination result 64 that is an example of lifespan determination information for determining whether the estimation result satisfies a lifespan reference condition. The lifespan reference condition used for this determination is an example of a required lifespan condition of the present invention, and is, for example, the performance condition required for the capacitor mounted on a product. The lifespan reference condition is set, for example, when the capacitor subjected to the lifespan estimation process is selected or when the drive condition is input.

Additionally, the determination result of the capacitor includes, for example, information for selecting another capacitor when the lifespan reference condition is not satisfied, and advice information for changing types of an electrolytic solution and foil constituting the capacitor and a loading amount of the electrolytic solution. This advice information is an example of capacitor lifespan value improvement information of the present invention. In the generation of the advice information, for example, conditions of a capacitor and components thereof satisfying the lifespan reference condition may be determined by using a calculation equation of the lifespan estimation value.

The information processing device 50 performs the lifespan determination process by executing the capacitor lifespan estimation program and generates the lifespan determination information including any one or more of the lifespan estimation value, the determination result, and the advice information. In a process of generating the advice information, the information of the capacitor databases 62-1, 62-2, 62-3 . . . 62-N may be used for presenting selection information of other capacitors and components thereof on the basis of the capacitors subjected to the lifespan estimation process.

The operation input part 56 includes, for example, a keyboard, a mouse, and other operation buttons, and is used for inputting the drive conditions, the temperature change characteristic information, the environmental conditions, the use conditions, etc. The operation input part 56 may be a touch panel using, for example, a touch sensor mounted on the display part 58 to perform an input process at a position where a worker touches the display part 58.

The display part 58 is an example of a means for displaying an operation screen of the capacitor lifespan estimation process and input data and for displaying a calculated lifespan estimation value. For example, as shown in A of FIG. 12, the display part 58 displays a state change information screen 66 including input drive conditions "Mission Profile" and calculation results "Simulation". The state change information screen 66 includes, for example, "Time" information that is an elapsed time of each step, which is the drive timing information 18, and "Ripple" information, which is the drive current value information 20. The screen also includes, as the lifespan estimation results, the calculated element center temperature of the capacitor, the electrolytic solution evaporation amount that is the state change information, etc.

Figure 12:
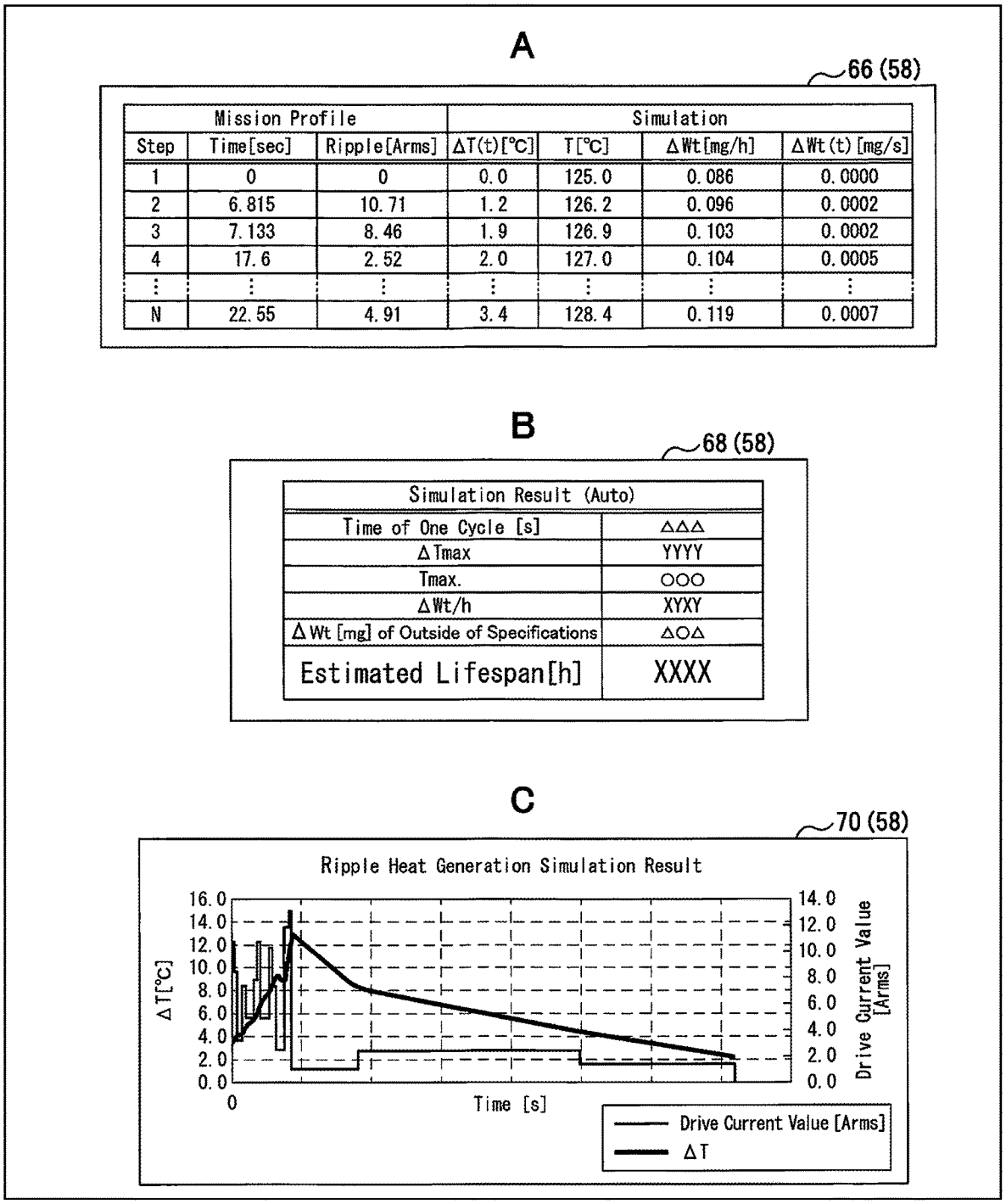
FIG. 12 is a diagram showing an example of a display screen of a lifespan estimation result.

For example, as shown in B of FIG. 12, the display part 58 displays a lifespan calculation result screen 68. The lifespan calculation result screen 68 is an example of a lifespan estimation display screen of the present invention and includes, for example, a time of one cycle of drive conditions, a calculated heat generation temperature, an evaporation reference value, an estimated lifetime, etc.

For example, as shown in C of FIG. 12, the display part 58 may display a graph including a change state of the drive current value, a change in heat generation temperature, a lifetime, etc. as a lifespan estimation simulation screen 70.

The I/O 60 is an example of input or output means for the outside of the information processing device 50 and is controlled by the processor 52. The information processing device 50 may be connected to, for example, an external memory or an external terminal device not shown to acquire the drive conditions, the temperature change characteristic information, and other information used for the capacitor lifespan estimation process and to output calculated lifespan estimation results. The information processing device 50 may have a communication function, for example.

<Capacitor Lifespan Estimation Process and Lifespan Determination Process>

Figure 13:
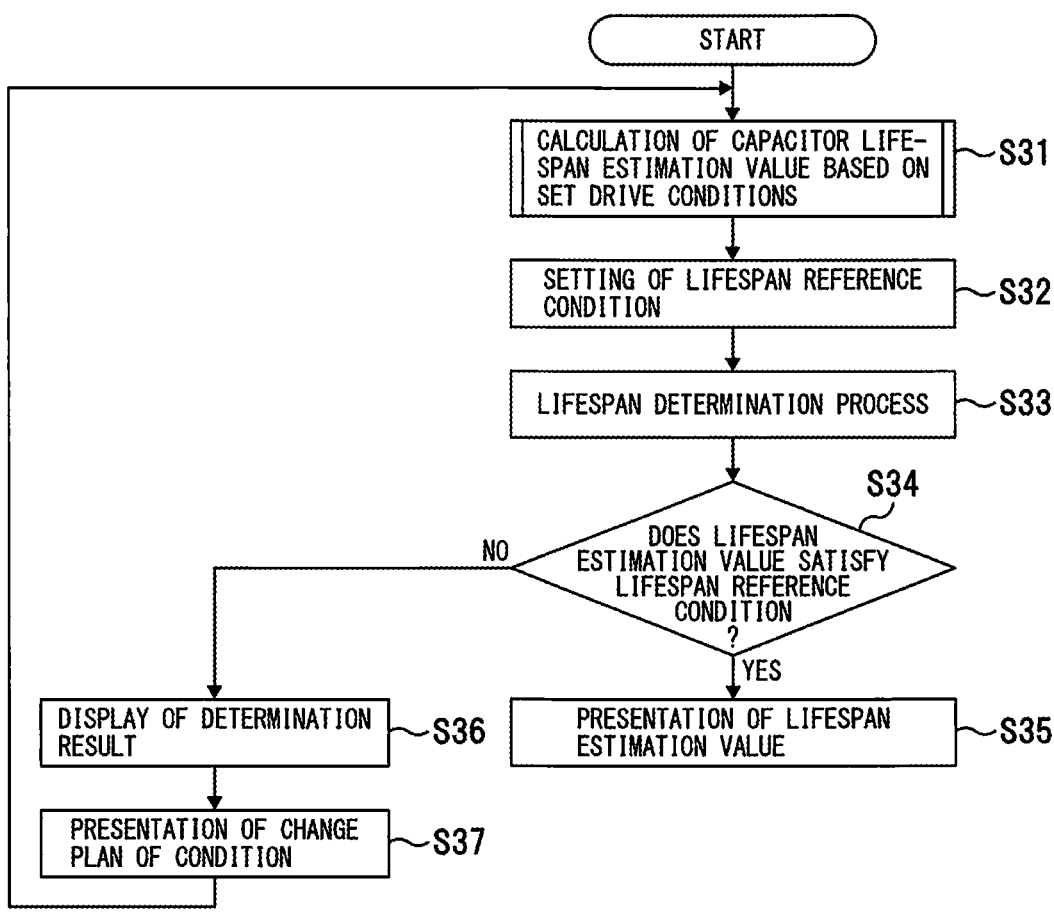
FIG. 13 is a flowchart showing an example of a capacitor lifespan estimation process and a lifespan determination process.

FIG. 13 shows an example of the capacitor lifespan estimation process and lifespan determination process. The process shown in FIG. 13 is an example of the capacitor lifespan estimation method or lifespan estimation program of the present invention. Process contents and process procedures shown in FIG. 13 are examples, and the present invention is not limited to such contents.

The information processing device 50 calculates a capacitor lifespan estimation value based on the set drive conditions (S31). The calculation process of the lifespan estimation value may be performed in the same way as the process contents described in the first embodiment or the second embodiment.

The information processing device 50 sets the lifespan reference condition (S32), performs the lifespan determination process of the calculated lifespan estimation value (S33), and determines whether the lifespan estimation value satisfies the lifespan reference condition (S34). This lifespan reference condition is an example of a comparison reference value for the lifespan estimation value, for example, and is time information or information of an evaporation amount of the electrolytic solution or an amount of the electrolytic solution remaining in the capacitor, serving as a value that can be compared with the calculated lifespan estimation value, for example. This lifespan estimation reference condition is a performance condition for a product lifespan set by, for example, a designer of the capacitor designer or a user wishing to purchase or design the capacitor.

When determining that the lifespan reference condition is satisfied (YES at S34), for example, the information processing device 50 presents the lifespan estimation value to the display part 58 as the lifespan determination information (S35). In this lifespan determination process, for example, a difference value between the lifespan estimation value and the lifespan reference condition may be calculated. The lifespan determination process may include a ranking process for the calculated difference value. In this ranking process, for example, a degree of consistency with the lifespan reference condition is set depending on a magnitude of the difference value. The information processing device 50 may also present the set rank information in presentation of the lifespan estimation value, for example. Furthermore, the information processing device 50 may display proposal information of another capacitor or a component constituting the capacitor selected by using the rank information in presentation of the lifespan estimation value. The ranking by calculating the difference value is an example of matching determination between the lifespan estimation value of the capacitor subjected to the lifespan estimation and the required lifespan reference condition. Specifically, the information processing device 50 may have a function of determining that the performance of the capacitor is excessive with respect to the lifespan condition desired by the user when the rank based on the difference value is high and presenting a change plan for lowering the specifications of the capacitor or components thereof.

The change plan presented in this case may use information on capacitors and components thereof for which lifespan estimation values have been calculated under equivalent drive conditions, for example. For example, if the presented change plan is selected, the information processing device 50 may return to step S31 to perform the capacitor lifespan estimation process according to the change plan.

When determining that the lifespan estimation value does not satisfy the lifespan reference condition (NO at S34), the information processing device 50 displays a determination result as the lifespan determination information (S36) and presents a change plan of the condition of the capacitor or the component thereof (S37). In this case, the information processing device 50 may read out selection candidates for a new capacitor and components thereof from the capacitor databases 62-1, 62-2, 62-3 . . . 63-N for the presentation. For example, in the lifespan determination process, the information processing device 50 may calculate a difference value between the lifespan estimation value and the lifespan reference condition and perform a ranking process for the difference value. This ranking is determination of insufficient capacity of a capacitor with respect to the lifespan reference condition. The information processing device 50 may use this rank information to present a determination result indicating that the selected capacitor cannot be used or may use this rank information to select a change plan for another capacitor or components thereof.

The information processing device 50 may perform the lifespan estimation value calculation process (S31) for the newly set capacitor or components thereof, for example.

Effect of the Third Embodiment

With this configuration, as with the first embodiment and the second embodiment, the simulation of the heat generation state and the lifespan estimation can be performed according to the usage state of the capacitor based on the drive conditions. The input information and the calculated lifespan estimation value can be displayed on the display screen of the information processing device 50 by using numerical values, graphs, etc., so that the recognizability of the operating state of the capacitor corresponding to the drive conditions can be improved. Additionally, by considering the temperature change characteristics including the thermal resistance, thermal capacity, and the temporal factor according to thermal time constant of the capacitor, the state analysis accuracy can be improved when the drive current value exceeding the rated value flows in the actual operating state. Since such a highly accurate simulation is enabled, the analysis of state and determination on availability of capacitors can be performed without creating an experimental machine tailored to the drive conditions or performing an operation experiment thereof, so that the convenience to customers using the capacitors is enhanced. Furthermore, a result of determination on whether the required lifespan condition is satisfied is shown in terms of the calculated lifespan estimation value. If the required lifespan condition is not satisfied or the performance of the selected capacitor is over performance, alternative information for the capacitor or components thereof is presented. Consequently, a capacitor at a level applicable or appropriate to a product can be designed and provided. As a result, the reliability of the capacitor for the product can be improved, and the convenience of the user purchasing or using the capacitor can be improved.

Features and modifications of the embodiments described above are listed below.

(1) The embodiments relates to a capacitor estimated lifespan calculation method for calculating a lifespan of a capacitor on which a ripple current is superimposed in a short time. This estimated lifespan calculation includes a step of estimating an element center temperature taking time into consideration from thermal resistance and thermal capacity, for example.

(2) The calculation also includes a step of estimating an electrolytic solution evaporation amount from the element center temperature estimated by the estimated lifespan calculation, and a step of estimating a lifespan from the estimated electrolytic solution evaporation amount and an electrolytic solution evaporation amount at the end of a lifespan obtained from a past lifespan test etc.

Furthermore, the calculation includes a step of combining multiple use conditions using the Miner's rule.

(3) In the embodiments, the transition of the heat generation temperature is analyzed based on given drive conditions and the lifespan estimation value is calculated; however, the present invention is not limited thereto. A drive condition may be set by determining a drive current value and a drive timing condition with respect to a set lifetime by using the lifespan estimation process of the present invention.

(4) In the capacitor lifespan estimation method of the present invention, a capacitor suitable for a use condition may be selected and presented to a customer based on the assumed or set operating conditions, the transition of the self-heating state of the capacitor, and the lifespan estimation result.

(5) In the embodiments, regarding the temperature change characteristic information of the capacitor, the time required for the temperature difference between the final reached temperature (the temperature when ripple is OFF) and the initial temperature of the capacitor to decrease by 63.2[%] is obtained for the calculation of the thermal time constant $\tau$; however, the present invention is not limited thereto. For the calculation of the thermal time constant $\tau$, for example, a change time from a predetermined temperature to a predetermined reached temperature (temperature when ripple is ON) may be used.

(6) In the embodiments, the lifespan is calculated for the preset drive conditions; however, the present invention is not limited thereto. The lifespan estimation device, the lifespan estimation method, and the lifespan estimation program of the present invention may be used for a vehicle or equipment equipped with a capacitor, for example. Specifically, the vehicle or the equipment executes the lifespan estimation program etc. to function as the lifespan estimation device of the present invention. The vehicle or the equipment may perform the lifespan estimation process for the usage state up to the present based on a drive current value applied to the capacitor and an accumulated drive current value already recorded.

(7) In the embodiments, the evaporation reference value is used to determine the lifespan of the capacitor; however, the present invention is not limited thereto. The lifespan estimation process may use the weight of the capacitor calculated or estimated by using the calculated evaporation amount, for example.

(8) In the embodiments, the estimated heat generation temperature of the capacitor element is calculated according to the drive conditions and the lifespan estimation process is performed based on the estimated heat generation temperature; however, the present invention is not limited thereto. For example, the processing part 8 may set an upper limit threshold value for the calculated estimated heat generation temperature and make an alarm notification when an obtained result shows that the estimated heat generation temperature exceeds the upper limit threshold value. In this lifespan estimation process, the heat generation transition in the case of application of a high drive current value can be calculated by using the temperature change characteristic information. In this case, for example, a heat-resistant temperature of a capacitor case, a deterioration temperature of the electrolytic solution, or a heat-resistant temperature of the vehicle equipped with the capacitor may be set as the upper limit threshold value so as to determine the drive conditions under which the upper limit threshold value may be reached. As a result, this capacitor lifespan estimation method can ensure the safety of the capacitor in accordance with the use conditions and the use environment and can enhance the selectivity of the capacitor corresponding to the use conditions.

As described above, the most preferable embodiments etc. of the present invention have been described. The present invention is not limited to the above description. The present invention can variously be modified and altered by those skilled in the art based on the spirit of the invention described in claims or disclosed in the description of embodiments. These modifications and alterations naturally fall within the scope of the present invention.

INDUSTRIAL APPLICABILITY

In the present invention, the heat generation temperature is estimated by using the temperature change characteristic information including the thermal resistance and the thermal capacity of the capacitor, the thermal time constant thereof etc., and the lifespan estimation value is calculated from the state change information of the capacitor according to the heat generation state, so that the capacitor lifespan estimation can be performed with respect to the drive condition in which a high current flows in a short time, which is useful.

REFERENCE SIGNS LIST 2 lifespan estimation device
4 input part
6 storage part
8 processing part
10 heat generation estimation part
12 lifespan estimation part
14 database
16 data storage part
18 drive timing information
20 drive current value information
22, 22-1, 22-2, 22-3, . . . 22-N drive condition
24 temperature change characteristic information
26 evaporation reference value
28 state change information
30 lifespan estimation result
40, 40-1, 40-2, 40-3 environmental condition
42 use condition
50 information processing device
52 processor
54 memory
56 operation input part
58 display part
60 input/output part (I/O)
62-1, 62-2, 62-3 . . . 62-N capacitor database
64 determination result
66 state change information screen
68 lifespan calculation result screen
70 lifespan estimation simulation screen

The invention claimed is:

1. A capacitor lifespan estimation method comprising:
calculating an estimated heat generation temperature by using drive conditions at least including drive timing information and drive current value information, and temperature change characteristic information of a capacitor, the drive timing information being indicative of a plurality of times from a start timing of the capacitor, the drive current value information being indicative of a plurality of drive current values corresponding to the plurality of times respectively, the plurality of drive current values being each indicative of a drive current value at a corresponded time of the plurality of times and fluctuating, the temperature change characteristic information including an equivalent series resistance, a thermal resistance, and a thermal capacity of the capacitor;
calculating an evaporation amount of an electrolytic solution of the capacitor after elapse of a reference time by using the estimated heat generation temperature; and
calculating a lifespan estimation value of the capacitor by using the evaporation amount of the electrolytic solution.

2. The capacitor lifespan estimation method according to claim 1, comprising:
calculating an estimated evaporation value of the electrolytic solution of the capacitor in a set drive time by using the evaporation amount of the electrolytic solution of the capacitor, and
calculating the lifespan estimation value by using the estimated evaporation value and an evaporation reference value of the electrolytic solution.

3. The capacitor lifespan estimation method according to claim 1, further comprising calculating a composite lifespan estimation value by using the lifespan estimation value, drive environment temperature information of the capacitor, and rate information of occurrence of the drive environment temperature information and the drive conditions.

4. The capacitor lifespan estimation method according to claim 1, wherein the reference time includes a time for applying a drive current to the capacitor and a time until the heat generation temperature of the capacitor becomes equal to or less than a predetermined temperature after stop of the application of the drive current.

5. The capacitor lifespan estimation method according to claim 1, further comprising:
determining whether the calculated lifespan estimation value satisfies a required lifespan condition, and
using this determination result to generate lifespan determination information including any one or more of the lifespan estimation value, the determination result, and lifespan value improvement information of the capacitor.

6. A capacitor designed by using the lifespan estimation value calculated by the capacitor lifespan estimation method according to claim 1.

7. A capacitor, wherein the lifespan estimation value calculated by the capacitor lifespan estimation method according to claim 1.

8. The capacitor lifespan estimation method according to claim 2, further comprising calculating a composite lifespan estimation value by using the lifespan estimation value, drive environment temperature information of the capacitor, and rate information of occurrence of the drive environment temperature information and the drive conditions.

9. The capacitor lifespan estimation method according to claim 2, wherein the reference time includes a time for applying a drive current to the capacitor and a time until the heat generation temperature of the capacitor becomes equal to or less than a predetermined temperature after stop of the application of the drive current.

10. The capacitor lifespan estimation method according to claim 3, wherein the reference time includes a time for applying a drive current to the capacitor and a time until the heat generation temperature of the capacitor becomes equal to or less than a predetermined temperature after stop of the application of the drive current.

11. An information processing device having a capacitor lifespan estimation function, comprising:
an input part through which drive conditions at least including drive timing information and drive current value information are to be input, the drive timing information being indicative of a plurality of times from a start timing of the capacitor, the drive current value information being indicative of a plurality of drive current values corresponding to the plurality of times respectively, the plurality of drive current values being each indicative of a drive current value at a corresponded time of the plurality of times and fluctuating, the temperature change characteristic information including an equivalent series resistance, a thermal resistance, and a thermal capacity of the capacitor;
a storage part being configured to store the drive conditions and temperature change characteristic information of a capacitor; and
a processing part including a heat generation estimation part being configured to calculate an estimated heat generation temperature by using the drive conditions and the temperature change characteristic information, and a lifespan estimation part being configured to calculate an evaporation amount of an electrolytic solution of the capacitor after elapse of a reference time by using the estimated heat generation temperature and calculate a lifespan estimation value of the capacitor by using the evaporation amount of the electrolytic solution.

12. The information processing device according to claim 11, wherein the lifespan estimation part calculates an estimated evaporation value of the electrolytic solution of the capacitor in a set drive time by using the evaporation amount of the electrolytic solution of the capacitor and calculates the lifespan estimation value by using the estimated evaporation value and an evaporation reference value of the electrolytic solution.

13. The information processing device according to claim 11, wherein the processing part calculates a composite lifespan estimation value by using the lifespan estimation value, drive environment temperature information of the capacitor, and rate information of occurrence of the drive environment temperature information and the drive conditions.

14. The information processing device according to claim 11, wherein the reference time includes a time for applying a drive current to the capacitor and a time until the heat generation temperature of the capacitor becomes equal to or less than a predetermined temperature after stop of the application of the drive current.

15. The information processing device according to claim 11, wherein the processing part determines whether the calculated lifespan estimation value satisfies a required lifespan condition and uses this determination result to generate lifespan determination information including any one or more of the lifespan estimation value, the determination result, and lifespan value improvement information of the capacitor.

16. The information processing device according to claim 11, further comprising a display part, wherein
the processing part generates, and displays on the display part, a lifespan estimation display screen using at least the lifespan estimation value and the drive conditions.

17. The information processing device according to claim 12, wherein the processing part calculates a composite lifespan estimation value by using the lifespan estimation value, drive environment temperature information of the capacitor, and rate information of occurrence of the drive environment temperature information and the drive conditions.

18. The information processing device according to claim 12, wherein the reference time includes a time for applying a drive current to the capacitor and a time until the heat generation temperature of the capacitor becomes equal to or less than a predetermined temperature after stop of the application of the drive current.

19. The information processing device according to claim 13, wherein the reference time includes a time for applying a drive current to the capacitor and a time until the heat generation temperature of the capacitor becomes equal to or less than a predetermined temperature after stop of the application of the drive current.

* * * * *